United States Patent [19]

Feistel

[11] Patent Number: 4,659,995
[45] Date of Patent: Apr. 21, 1987

[54] ACTIVE FOURTH-DEGREE FILTER ELEMENT

[75] Inventor: Karl H. Feistel, Nuremberg, Fed. Rep. of Germany

[73] Assignee: Karl-Heinz Feistel, Nuremberg, Fed. Rep. of Germany

[21] Appl. No.: 640,420

[22] Filed: Aug. 13, 1984

[30] Foreign Application Priority Data

Aug. 12, 1983 [DE] Fed. Rep. of Germany ....... 3329195

[51] Int. Cl.$^4$ ........................... H03F 1/00; H03B 1/66
[52] U.S. Cl. .................................... 328/167; 328/138; 328/139; 307/543; 307/556; 307/564
[58] Field of Search ............... 328/127, 138, 139, 167; 307/543, 552, 553, 555, 556, 564

[56] References Cited

U.S. PATENT DOCUMENTS

| 3,716,729 | 2/1973 | Rollett | 328/167 |
| 3,886,469 | 5/1975 | Rollett et al. | 330/107 |
| 3,987,381 | 10/1976 | Szechenyi | 330/80 R |
| 4,032,857 | 6/1977 | Lum | 330/151 |
| 4,110,692 | 8/1978 | Pradal | 325/147 |

OTHER PUBLICATIONS

"Introduction to Filter Theory", by David Johnson, 1976, Prentice Hall, Inc., pp. 245-249.
"Einfacher Spannungs-Frequencz-Umsetzer", published in German Magazine Electronik, vol. 14 of 16 Jul. 1982, pp. 48-50.
"Aktives Selektivfilter mit Programmiervarer Bandbreite" by Horst Lütgens, in German Magazine Elektronik, vol. 14/16.7, 1982.
"Operational Amplifiers" edited by J. G. Graeme et al, McGraw-Hill Book Company, copyright by Burr-Brown Research Corp., Fig. 815, p. 308.
"Halbleiter-Schaltungstechnik" by U. Tietze-Ch. Schenk, 1978.

Primary Examiner—Stanley D. Miller
Assistant Examiner—Richard Roseen
Attorney, Agent, or Firm—Karl F. Ross; Herbert Dubno

[57] ABSTRACT

An active filter element of the fourth degree, to be connected in series with other such elements in forming a band-pass or band-stop filter of adjustable bandwidth, is a four-terminal network with three cascaded operational amplifiers interconnected by two mutually identical series resistors each inserted between the output of one amplifier and the noninverting input of the next one. The first operational amplifier, serving as an inverting adder, has its inverting input connected by two resistors to its own output and to the output of the third amplifier; the second and third operational amplifiers have their inverting inputs directly connected to their respective outputs to act as voltage followers. The two series resistors are longitudinal branches of respective frequency-dependent voltage dividers each further comprising a transverse branch connected to the junction of the corresponding resistor with the noninverting input of the next-following operational amplifier. The transverse branch may be, for a band-pass or a band-stop filter, a combination of a capacitor and an inductance in parallel or in series. In a particular instance, that branch is constituted by an active negative oscillatory circuit preceded by a negative-immittance converter. A fourth operational amplifier may have its inverting input connected via further series resistors to the outputs of the first and third amplifiers and its noninverting input connected via yet another resistor to the output of the second amplifier for the purpose of introducing an attenuation pole at a finite frequency. Finally, an equalizer including a fifth operational amplifier may be interposed between the first amplifier and the first series resistor.

16 Claims, 14 Drawing Figures

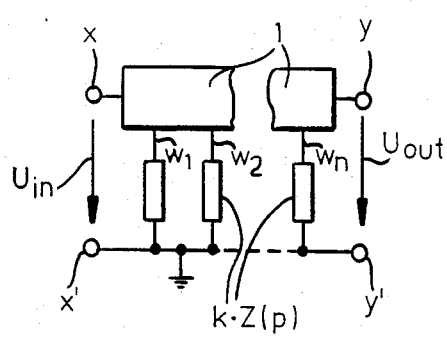
FIG.1
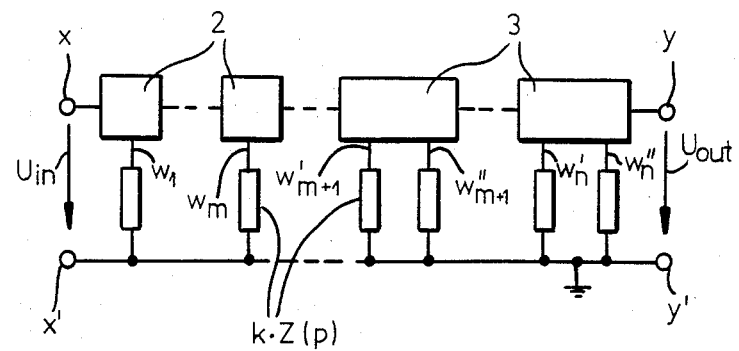
FIG.2
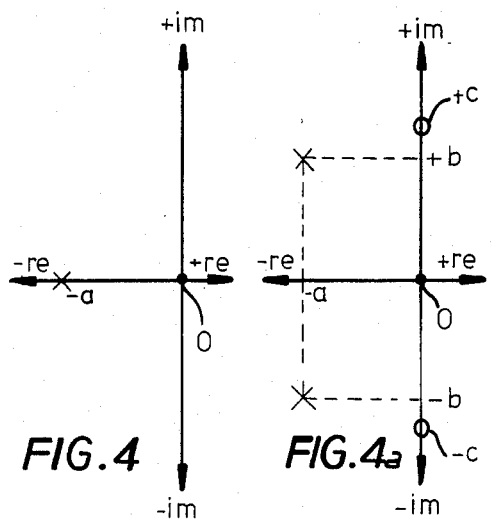
FIG.4
FIG.4a
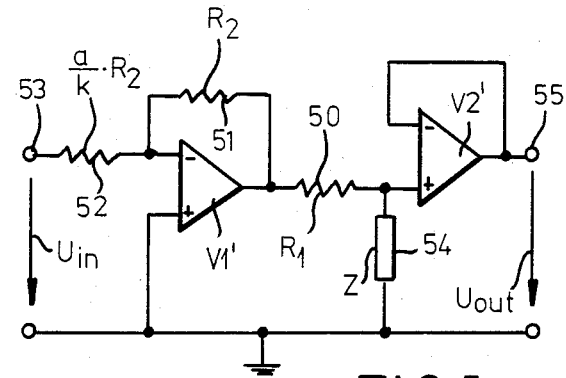
FIG.5
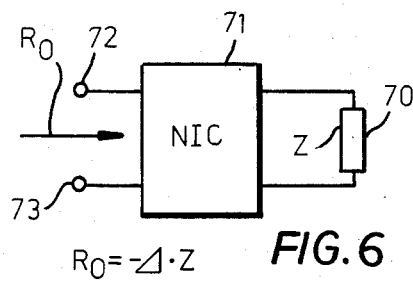
FIG.6
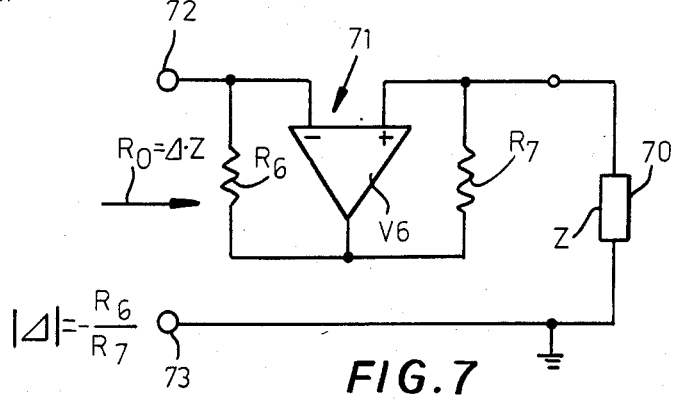
FIG.7
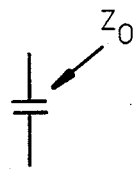
FIG.3
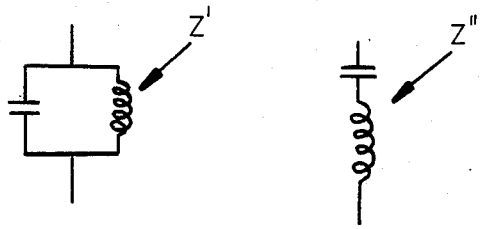
FIG.3a    FIG.3b

ACTIVE FOURTH-DEGREE FILTER ELEMENT

FIELD OF THE INVENTION

My present invention relates to an active $4^{th}$-degree filter element to be connected in series with other elements of similar character in forming a band-pass or band-strip filter of adjustable bandwidth.

BACKGROUND OF THE INVENTION

Such filters are employed, for example, in selective receivers and in frequency analyzers. Conventional band-pass filters utilizing both active RC technology and passive LC technology have a bandwidth inherent in the magnitude of their components. This makes a change in bandwidth difficult, especially with highly selective filters requiring a precise correlation among their components; this correlation cannot be maintained in the case of a changeover which therefore is generally replaced by a switching among the entire filtering units.

An active selective filter with programmable bandwidth is known from the German magazine ELECTRONIK, Vol. 14 of 16 July 1982, pages 48–50. That filter comprises a BCD/decimal decoder with ten outputs respectively connected to the junction points of a chain of eleven cascaded resistors forming part of an active RC network. Though that circuit arrangement enables the selection of ten different bandwidths, its amplification changes with the bandwidth so that a similarly switchable compensation stage must be combined therewith in order to provide a constant overall amplification.

Another active band-pass filter, described in Vol. 7 of ELECTRONIK 1975, pages 46 and 47, enables variations of its Q-factor and its resonant frequency but these adjustments entail a change in its basic attenuation, accepted as unavoidable.

OBJECTS OF THE INVENTION

Thus, the general object of my invention is to provide a filter element as set forth above which can be adjusted in bandwidth while maintaining an independent attenuation characteristic and a constant amplification in midband.

A more particular object is to provide a filter element of this character which can be conveniently switched between band-pass and band-stop operation.

SUMMARY OF THE INVENTION

Such a filter element comprises, in accordance with my present invention, a 4-terminal network with a nonaccumulating basic circuit extending between a pair of input terminals and a pair of output terminals, one terminal of each pair being grounded. The basic circuit includes three cascaded operational amplifiers, the first one being designed as an inverting adder while the other two serve as voltage followers. A first series resistor is inserted between the output of the first operational amplifier and the noninverting input of the second operational amplifier while a second series resistor of the same magnitude is inserted between the output of the second operational amplifier and the noninverting input of a third operational amplifier. An at least partly reactive first transverse impedance inserted between ground and the downstream end of the first series resistor forms therewith a first frequency-dependent voltage divider. Analogously, a second transverse impedance identical with the first one is inserted between ground and the downstream end of the second series resistor, forming therewith a second frequency-dependent voltage divider. The first operational amplifier has its noninverting input grounded and its inverting input connected by means of three further resistors to the ungrounded input terminal, to the output of the first operational amplifier and to the output of the third operational amplifier, respectively. The ratio of the two series resistors to the two transverse impedances is adjustable for varying the bandwidth of the filter element.

The change in bandwidth may therefore be carried out by providing either the two series resistors or the two transverse impedances with common adjustment means. In an advantageous embodiment, in which each transverse impedance comprises an active parallel-tuned oscillatory circuit working into a negative-immittance converter (NIC) including another operational amplifier with two collateral resistors connecting its inverting and noninverting inputs to its output, the filter bandwidth can be changed by adjusting one of the two collateral resistors of each converter. Reference may be made to "OPERATIONAL AMPLIFIERS" edited by Jerald G. Graeme et al, McGraw-Hill Book Company, copyright 1971 by Burr-Brown Research Corporation, showing such a negative-immittance converter in FIG. 8.15 on page 308. A transverse impedance of this description is regarded as a feature of my invention even when used in connection with a different type of filter element.

Another feature of my invention enables the realization, in a band-pass filter, of an attenuation pole at a selected frequency within the band, thereby dividing the pass band into two subbands separated from each other. For this purpose I include in the basic circuit a fourth operational amplifier, similar to the first one and also serving as an inverting adder, having its output connected to the ungrounded output terminal of the filter element and further connected through a pair of serially interconnected resistors to the output of the first operational amplifier, the junction of these interconnected resistors being connected to the inverting input of the fourth operational amplifier which is also connected by means of a third series resistor to the output of the third operational amplifier. The noninverting input of this fourth operational amplifier is connected by two additional resistors to ground and to the output of the second operational amplifier, respectively. Analogous circuitry enables the establishment of a transfer pole in the band of a filter element of the band-stop type.

BRIEF DESCRIPTION OF THE DRAWING

The above and other features of my invention will now be described in detail with reference to the accompanying drawing in which:

FIG. 1 diagrammatically shows a filter element of the general type here contemplated;

FIG. 2 is a similar diagrammatic view, showing a chain of $2^{nd}$-degree and $4^{th}$-degree filter elements with one and two transverse impedances, respectively;

FIGS. 3, 3a and 3b show three different configurations of transverse impedances for filter elements such as those shown in FIGS. 1 and 2;

FIGS. 4 and 4a show poles and zeroes for the transfer functions of a $1^{st}$-degree and a $2^{nd}$-degree filter element;

FIG. 5 is a circuit diagram of an active $2^{nd}$-degree filter element as shown in FIG. 2;

FIG. 6 schematically shows the combination of a negative-immitance converter with an associated impedance element to form one of the transverse impedances shown in FIGS. 1, 2 and 5;

FIG. 7 shows details of the negative-immitance converter in the circuit arrangement of FIG. 6;

SPECIFIC DESCRIPTION

Figure 10:
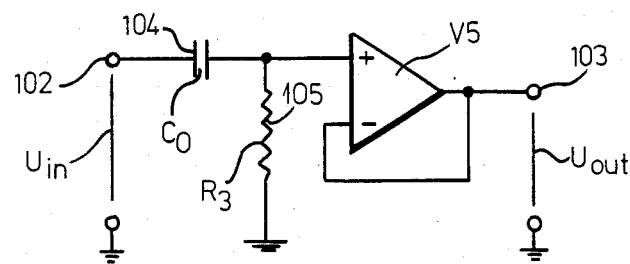
FIG. 10 is a diagram of a compensatory circuit insertable into the filter elements of FIGS. 8 and 9.

FIG. 1 shows a filter element comprising a nonaccumulating basic circuit 1 with (n+2) ports, namely an input port x, an output port y and n intermediate ports $w_1$–$w_n$. Ports x and y form part of pairs of input and output terminals x, x' and y, y', terminals x' and y' being grounded. Also indicated are an input voltage $U_{in}$ and an output voltage $U_{out}$ respectively appearing across terminals x, x' and y, y'. Each intermediate port is connected to ground through one of n mutually identical reactive impedances of magnitude k·Z(p), establishing a transfer function $$H(p) = U_{in}/U_{out} = \prod_{\nu=1}^{n} H_\nu[k \cdot Z(p)] \quad (1)$$

In that equation, $\nu$ counts the intermediate ports whereas p is a function of frequency given by $$p = j \cdot \Omega = j \cdot \frac{f}{f_r}, \quad (2)$$

$f_r$ being a normative or reference frequency (generally a midfrequency of the band). Furthermore, $$Z(p) = z(p) \cdot R_r \quad (3)$$

where $R_r$ is a normative or reference resistance and z(p) is a function of the 2-terminal network constituting reactance Z(p). The function Z(p) is purely imaginary for real frequencies. Since the basic circuit is free from energy accumulators, a change in the factor k (which is also real and could be 1) merely involves a distortion of the frequency scale of the attenuation function $$A(\Omega) = -20 \log |H[k \cdot Z(j \cdot \Omega)]| dB \quad (4)$$

without any modification of the selection characteristic (e.g. Chebyshev or Cauer behavior). Function z(p) provides solely a frequency transformation determining whether the resulting network will act as a band pass or a band stop, for instance. As a starting point, one may use a low-pass filter element whose transverse reactance or reactances are simple capacitors as shown at $Z_0$ in FIG. 3.

FIG. 2 shows a chain filter with m $2^{nd}$-degree filter elements 2 and n $4^{th}$-degree filter elements 3 in cascade with one another. Elements 2 each have a single intermediate port $w_1$–$w_m$ while each element 3 has two such ports $w'_{m+1}$–$w'_n$ and $w''_{m+1}$–$w''_n$. As in FIG. 1, each intermediate port is grounded through a transverse impedance k·Z(p), all mutually identical. The overall transfer function $H_{ov}(p)$ is here given by $$H_{ov}(p) = \frac{U_{in}}{U_{out}} = \prod_{\nu=1}^{m} H_\nu[k \cdot Z(p)] \cdot \prod_{\nu=m+1}^{m+n} H_\nu[k \cdot Z(p)] \quad (5)$$

This means that the product of the individual transfer functions of the m $2^{nd}$-degree filter elements 2 is multiplied by the product of the transfer functions of the n $4^{th}$-degree filter elements 3. With m=n=2, equation (5) becomes $$H_{ov}(p) = \{\pi H2[k \cdot Z(p)]\}^2 \{\pi H2[k \cdot Z(p)]\}^2 \quad (5')$$

with H2 and H4 respectively denoting the transfer functions of elements 2 and 3.

Converting the fundamental low-pass filter element with two transverse impedances $Z_0$ in the form of capacitors, as shown in FIG. 3, into a band-pass or band-stop element calls for a replacement of that capacitor by a parallel-resonant circuit, as shown at Z' in FIG. 3a, or by series-resonant circuit, as shown at Z" in FIG. 3b. This corresponds to a transformation of parameter p into $$\frac{1}{\Delta} \cdot \left(p + \frac{1}{p}\right)$$

in the first instance and into $$\frac{\Delta}{p + \frac{L}{p}}$$

in the second instance. With such a frequency transformation the attenuation curve of the filter becomes symmetrical with reference to the frequency plotted logarithmically on the abscissa.

With k=1, the transverse impedances of a low-pass filter element can be rewritten $$Z(p) = R_r \cdot z(p) = \frac{1}{j\alpha x} = \frac{1}{j \cdot \frac{\omega}{\omega_r} \cdot \omega_r \cdot C} = \frac{1}{j\omega_r C} \quad (6)$$

since $\omega = 2\pi f$ and $\omega_r = 2\pi f_r$.

Figure 8:
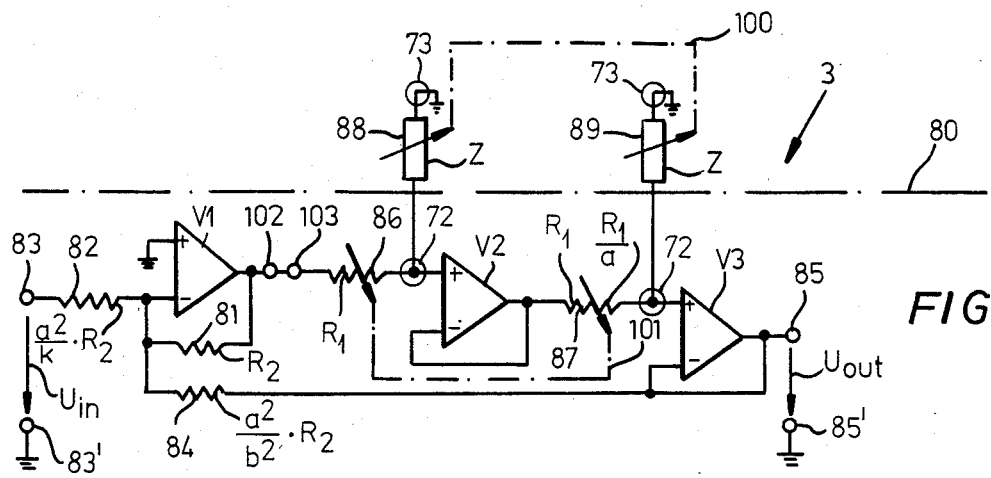
FIG. 8 is a block diagram of a $4^{th}$-degree filter element according to my invention.

The transfer function $H_{LP}(p)$ of such a filter element of first degree is given by $$H_{LP}(p) = \frac{k_{LP}}{p + a} \quad (7)$$

where a is the real component of the transfer pole. Such a filter element is illustrated in FIG. 8.3 on page 289 of the book "OPERATIONAL AMPLIFIERS" identified above.

For a second-degree filter element, the corresponding equation is $$H_{LP}(p) = \frac{k_{LP}}{p^2 + 2ap + a^2 + b^2} \quad (8)$$

where b is the imaginary component of the pole. If it is desired to provide the filter element with an attenuation pole or zero transfer function at a finite frequency, formula (8) is replaced by $$H_{LP}(p) = \frac{k_{LP} \cdot (p^2 + c^2)}{p^2 + 2ap + a^2 + b^2} \qquad (9)$$

where c denotes the zero point of the transfer function.

FIG. 4 shows the complex diagram pertaining to the filter element of equation (7), given by a real axis ±re and an imaginary axis ±im intersecting at an origin 0. The parameter a lies on the negative branch of the real axis.

In FIG. 4a I have shown a similar diagram pertaining to the $2^{nd}$-degree filter element discussed with reference to equations (8) and (9). Zero points or attenuation poles ±c are located on branches +im and −im on which there also are indicated the imaginary components ±b of transfer poles −a, +b and −a, −b indicated by small crosses.

Any desired low-pass transfer function can be obtained by serially interconnecting such $2^{nd}$-degree and $4^{th}$-degree filter elements as shown in FIG. 2.

For a filter element with given attenuation curve the zeroes and poles can be determined experimentally, with progressive approximation. With standard low-pass filters (exponential, Chebyshev or Cauer) these values are available in the literature along with factor k.

FIG. 5 illustrates details of a $2^{nd}$-degree filter element with an ungrounded input terminal 53 connected via a resistor 52 to the inverting input of a first operational amplifier V1' connected as an inverting adder, having its output connected through a resistor 51 to its inverting input and havings its noninverting input grounded. The output of amplifier V1' is linked by way of a series resistor 50 to the noninverting input of a second operational amplifier V2' designed as a voltage follower whose output is directly connected to its inverting input as well as to an ungrounded output terminal 55. The two operational amplifiers and the two series resistors 50, 52 constitute a nonaccumulating basic circuit. A transverse impedance 54 of magnitude Z is connected to the downstream end of resistor 50 and thus to the noninverting input of amplifier V2'; impedances 50 and 54 constitute longitudinal and transverse branches of a frequency-dependent voltage divider biasing that noninverting input. Resistor 50 has a magnitude $R_1$ which corresponds to $R_r$ of equation (3). Resistor 51 has a magnitude $R_2$ while the magnitude of resistor 52 = $\frac{a}{k} \cdot R_2$, with a and k having the same significance as before. Thus, the filter element of FIG. 5 operates in conformity with equation (7) if impedance Z is purely capacitive as in FIG. 3.

When impedance 54 corresponds to Z' of FIG. 3a or Z'' of FIG. 3b, rather than to $Z_0$ of FIG. 3, the low-pass filter element of FIG. 5 is transformed into a band-pass or a band-stop element as discussed above.

FIG. 6 shows a more complex transverse impedance including an impedance element 70 of magnitude Z connected across the output of an NIC 71 converting magnitude Z into an entrance impedance $R_0 = -\Delta \cdot Z$ appearing across a pair of input terminals 72, 73. NIC 71, shown in detail in FIG. 7, comprises an operational amplifier V6 whose output is connected through a first collateral resistor $R_6$ to its inverting input and through a second collateral resistor $R_7$ to its noninverting input.

The conversion factor Δ is given by $$|\Delta| = -\frac{R_6}{R_7} \qquad (10)$$

yielding $$R_O = -\frac{R_6}{R_7} \cdot Z.$$

Impedance 70 advantageously is an active parallel-tuned oscillatory circuit as described hereinafter with reference to FIG. 11. Since the impedance of such a circuit is negative, entrance impedance $R_0$ is then of positive magnitude and appears between ground and the inverting input of operational amplifier V6 tied to terminal 72.

Reference will now be made to FIG. 8 showing an embodiment of a $4^{th}$-degree filter element 3 according to my invention. The nonaccumulating basic circuit of that element is disposed below a horizontal dot-dash line 80 separating that circuit from two transverse impedances 88, 89 of magnitude Z. The basic circuit comprises a 4-terminal network with input terminals 83, 83' and output terminals 85, 85' between which three operational amplifiers V1, V2 and V3 are connected in cascade. Amplifiers V1 and V2 correspond to amplifiers V1' and V2' of FIG. 5 and constitute, respectively, an inverting adder and a voltage follower. Amplifier V3 is another voltage follower substantially identical with amplifier V2. The inverting input of amplifier V1 is connected to ungrounded terminal 83 through a resistor 82; its noninverting input is grounded. Two further resistors 81 and 84 respectively connect the inverting input of amplifier V1 to its output 102 and to the output of amplifier V3 which is tied to the ungrounded terminal 85. For reasons that will become apparent hereinafter, output 102 is an internal terminal juxtaposed with another such terminal 103 separable therefrom and connected to the upstream end of a series resistor 86 whose downstream end, joined to the non-inverting input of amplifier V2, is connected by way of impedance 88 to ground. Analogously, the output of amplifier V2—which is directly connected to its inverting input—is connected through a series resistor 87 to the noninverting input of amplifier V3 which is also grounded through impedance 89.

Impedances 88 and 89 are shown to be jointly adjustable by a link 100. A similar link 101 interconnects series resistors 86 and 87 for joint adjustment. In practice, only one of these links need be provided for the purpose of varying the ratio between the magnitude Z of impedances 88, 89 and the magnitudes $R_1/a$ of resistors 86 and 87 in order to alter the bandwidth of the filter element pursuant to equation (10). Resistors 81 and 82 have respective magnitudes $R_2$ and $$\frac{a^2}{k} \cdot R_2.$$

Resistor 84 is equal to $$\frac{a^2}{b^2} \cdot R_2.$$

The maximum magnitude of resistors 86 and 87 equals the reference value $R_1$ discussed in connection with FIG. 5. Resistors 86 and 87 form with impedances 88 and 89 a pair of frequency-dependent voltage dividers, similar to divider 50, 54 of FIG. 5, adjustably biasing the noninverting inputs of operational amplifiers V2 and V3, respectively. With impedances 88 and 89 represented by capacitors, the transfer function of the low-pass filter element of FIG. 8 corresponds to equation (8), except for a negative sign.

Figure 9:
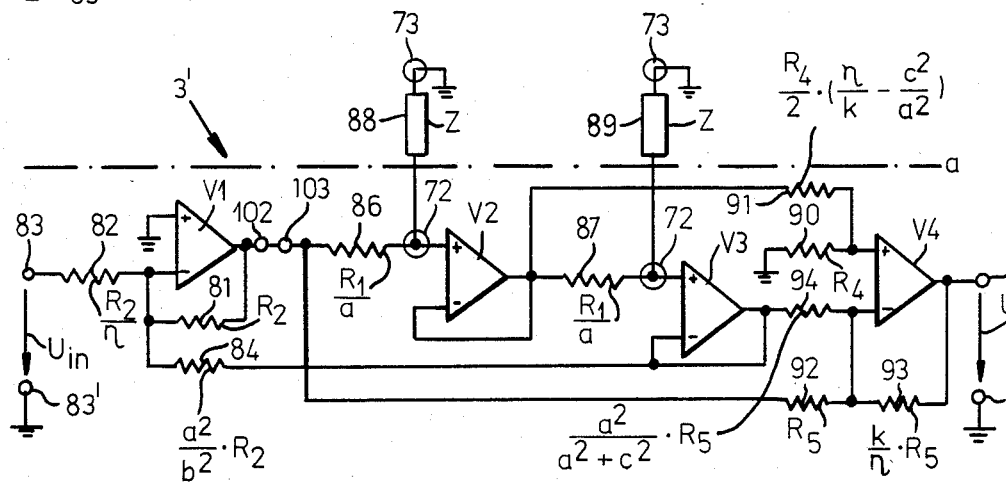
FIG. 9 is a block diagram similar to that of FIG. 8 but expanded to provide for an attenuation pole in the bandpass characteristic of a filter element.

FIG. 9 shows a $4^{th}$-degree filter element 3' which differs from element 3 of FIG. 8 by the presence of a fourth operational amplifier V4 interposed between the output of amplifier V3 and terminal 85, its inverting input being connected to the output of amplifier V3 by way of a resistor 94. Two serially interconnected resistors 92 and 93, whose junction is connected to the inverting input of amplifier V4, lie between the output of that amplifier and the upstream end of resistor 86. Resistors 92 and 93 have respective magnitudes $R_5$ and $$\frac{k}{\eta} \cdot R_5;$$

resistor 94 is equal to $$\frac{a^2}{a^2 + c^2} \cdot R_5.$$

Input resistor 82 is here of magnitude $R_2/h$. The noninverting input of amplifier V4, whose external connections are similar to those of amplifier V1 and which therefore also acts as an inverting adder, is grounded through a resistor 90 of magnitude $R_4$ and is connected to the inverting terminal of amplifier V2 through a resistor 91 of magnitude $$\frac{R_4}{2} \cdot \left( \frac{\eta}{k} - \frac{c^2}{a^2} \right).$$

Parameter $\eta$ is any desired real value whereas c is the zero point referred to above in connection with equation (9) and FIG. 4a. With impedances 88 and 89 again represented by capacitors, the transfer function of the low-pass filter element of FIG. 9 corresponds to equation (9), except for omission of the negative sign. With suitable modification of impedances 88, 89 (of FIGS. 3a and 3b) the pass or stop band of such a filter element can be subdivided at point c.

In FIG. 10 I have illustrated a 4-terminal equalizer network insertable between terminals 102 and 103 of FIG. 8 or FIG. 9. The equalizer is of high-pass character and comprises an operational amplifier whose noninverting input is connected to ground through a resistor 105 of magnitude $R_3$ and to terminal 102 through a capacitor 104 of magnitude $C_0$. The output of amplifier V5 is connected directly to its inverting input and to terminal 103.

Upon insertion into filter element 3 of FIG. 8, capacitance $C_0$ equals $$C_O = \frac{f_t}{2\pi f_r^2 \cdot \left( 4 + \frac{k + b^2}{a^2} \right) \cdot R_3} \quad (11)$$

where $f_t$ is the transition frequency of voltage followers V2 and V3; upon insertion into filter element 3' of FIG. 9 the formula for capacitance $C_0$ is $$C_O = \frac{f_t}{2\pi f_r^2 \cdot \left( 4 + \eta + \frac{b^2}{a^2} \right) \cdot R_3} \quad (12)$$

Figure 11:
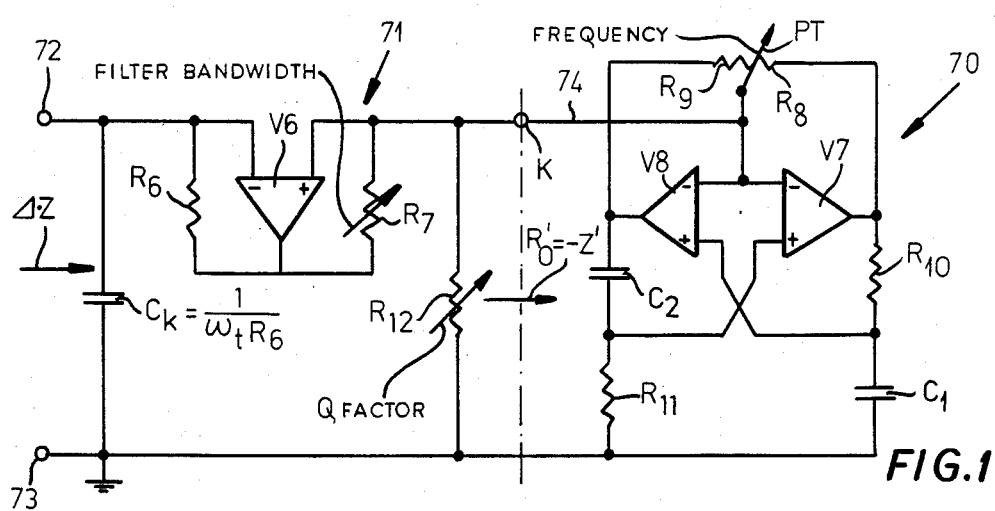
FIG. 11 shows a more elaborate embodiment of a transverse impedance of the type illustrated in FIGS. 6 and 7.

The 2-terminal network of FIGS. 6 and 7 is shown in detail in FIG. 11 where NIC 71 is the same as in FIG. 7, except that collateral resistor $R_7$ is shown to be adjustable. An internal terminal K lies in an ungrounded terminal lead 74 of network 70 which is connected to inverting inputs of two ancillary operational amplifiers V7 and V8 thereof whose outputs are also connected to lead 74 by way of two adjustable resistors $R_8$ and $R_9$ forming part of a potentiometer PT. The noninverting input of amplifier V7 is grounded through an additional resistor $R_{11}$ and is connected to the output of amplifier V8 through a capacitor $C_2$. Analogously, the noninverting terminal of amplifier V8 is grounded through a capacitor $C_1$ and connected to the output of amplifier V7 through an additional resistor $R_{10}$. Network 70, which operates in a manner comparable to that of impedance Z' of FIG. 3a, can thus be termed a parallel-tuned oscillatory circuit whose resonance frequency is controlled by potentiometer PT. An adjustable transverse resistor $R_{12}$, extending between terminal lead 74 and ground, enables adjustment of the Q-factor of network 70 while a further capacitor $C_k$, of magnitude $$\frac{1}{t \cdot R_6},$$

enables a compensation of the finite transition frequency $f_t$ of amplifier V6 and the corresponding pulsatance $\omega_t = 2\pi f_t$.

The adjustability of collateral resistor $R_7$ facilitates a change in the bandwidth of the filter element. Naturally, resistor $R_6$ could be so adjustable instead of resistor $R_7$. In any event, the adjustable collateral resistor is linked to its counterparts in any other transverse impedance by a connection such as that shown at 100 in FIG. 8; connection 100 and/or 101 is also to be used in the filter element 3' of FIG. 9.

The network of FIG. 11 could also be utilized for the transverse impedances of the multiport filter elements of FIGS. 1 and 2; likewise it may be employed as the single transverse impedance 54 of the $2^{nd}$-degree filter element of FIG. 5. With a generic filter element of $(2n)^{th}$ degree such as that shown in FIG. 1, the number of impedances to be simultaneously adjusted is equal to n.

I claim:

1. An active filter element of the fourth degree, comprising:
    a four-terminal network with a pair of input terminals and a pair of output terminals, one of said input terminals and one of said output terminals being grounded, another of said input terminals and another of said output terminals being ungrounded;
    a nonaccumulating basic circuit between said input and output terminals including an inverting adder and two voltage followers respectively provided by a first, a second and a third operational amplifier in cascade with one another, each of said operational amplifiers having a noninverting input, an inverting input and output, the output of said third operational amplifier being connected to said ungrounded output terminal;

a first series resistor having an upstream end connected to the output of said first operational amplifier and a downstream end connected to the noninverting input of said second operational amplifier;

a second series resistor of the same resistance magnitude as said first series resistor having an upstream end connected to the output of said second operational amplifier and a downstream end connected to the noninverting input of said third operational amplifier;

a reactive first transverse impedance inserted between ground and the downstream end of said first series resistor, forming therewith a first frequency-dependent voltage divider; and a second transverse impedance identical with said first transverse impedance inserted between ground and the downstream end of said second series resistor, forming therewith a second frequency-dependent voltage divider, the inverting inputs of said second and third operational amplifiers being connected with feedback loops, the noninverting input of said first operational amplifier being grounded, the inverting input of said first operational amplifier being connected by means of three further resistors individually to the ungrounded input terminal, to the output of said first operational amplifier and to the output of the third operational amplifier, said transverse impedances having resistances, the resistance ratio of said series resistors to said transverse impedances being adjustable by adjusting magnitudes of said series resistances for varying the bandwidth of the filter element.

2. A filter element as defined in claim 1 wherein the inverting inputs of said second and third operational amplifiers are directly connected to their respective outputs.

3. A filter element as defined in claim 1 wherein said basic circuit further includes a fourth operational amplifier serving as an inverting adder inserted between the output of said third operational amplifier and said ungrounded output terminal, said fourth operational amplifier having an output connected to the ungrounded output terminal and through a pair of serially interconnected resistors to the output of said first operational amplifier, an inverting input connected to a junction of said serially interconnected resistors and by means of a third series resistor to the output of said third operational amplifier, and a noninverting input connected by two additional resistors respectively to ground and to the output of said second operational amplifier, thereby introducing an attenuation pole at a finite frequency into a transfer function of the filter element.

4. A filter element as defined in claim 1 wherein said first and second series resistors are provided with common adjustment means for varying said bandwidth.

5. A filter element as defined in claim 1 wherein said first and second transverse impedances are provided with common adjustment means for varying said bandwidth.

6. A filter element as defined in claim 5 wherein each of said transverse impedances comprises an active parallel-tuned oscillatory circuit connected with a negative-immittance converter, the latter including an additional operational amplifier with an inverting input connected to the downstream end of the corresponding series resistor and by way of a first collateral resistor to the output of said additional operational amplifier, a noninverting input of said additional operational amplifier being connected by way of a second collateral resistor to the output thereof and being further connected to an ungrounded terminal lead of said parallel-tuned circuit also having a grounded terminal lead, one of said collateral resistors being provided with adjustment means for varying the conversion factor of said negative-immittance converter, the inverter inputs of said second and third operational amplifiers being connected with feedback loops, and with it said bandwidth.

7. A filter element as defined in claim 6 wherein said parallel-tuned circuit comprises a first and a second ancillary amplifier of operational type with inverting inputs connected to said ungrounded terminal lead and with outputs connected by way of respective adjustable ancillary resistors to said ungrounded terminal lead, said first ancillary amplifier having a noninverting input grounded through a first capacitor and connected to the output of said second ancillary amplifier through a first additional resistor, said second ancillary amplifier having a noninverting input grounded through a second additional resistor and connected to the output of said first ancillary amplifier through a second capacitor.

8. A filter element as defined in claim 7 wherein said adjustable ancillary resistors are part of a potentiometer enabling variation of a resonance frequency of said parallel-tuned oscillatory circuit.

9. A filter element as defined in claim 8 wherein said grounded and ungrounded terminals leads are bridged by another adjustable resistor enabling variation of a Q-factor possessed by said parallel-tuned oscillatory circuit.

10. A filter element as defined in claim 7 wherein a third capacitor lies between ground and the inverting input of said additional operational amplifier for modifying a transition frequency of said additional operational amplifier.

11. A filter element as defined in claim 1 wherein said basic circuit further comprises an equalizer of high-pass character inserted between the output of said first operational amplifier and said first series resistor.

12. A filter element as defined in claim 11 wherein said equalizer includes a supplemental operational amplifier with an inverting input connected to the output thereof and with a noninverting input capacitively connected to the output of said first operational amplifier while being grounded through a supplemental resistor.

13. An active filter element comprising:

a four-terminal network with a pair of input terminals and a pair of output terminals, one of said input terminals and one of said output terminals being grounded;

a nonaccumulating basic circuit between said input and output terminals including a first and a second operational amplifier in cascade with one another, each of said operational amplifiers having a noninverting input, an inverting input and an output;

a first series resistor connected to an upstream end to the output of said first operational amplifier and at a downstream end to the noninverting input of said second operational amplifier;

a second series resistor of the same resistance magnitude as said first series resistor having an upstream end connected to the output of said second operational amplifier and a downstream end connected to the noninverting input of said third operational amplifier; and a reactive first transverse impedance inserted between ground and the downstream end of said first series resistor, forming therewith a first frequency-dependent voltage divider; and a second transverse impedance inserted between ground and the downstream end of said second series resistor, forming therewith a second frequency-dependent voltage divider, the inverter inputs of said second and third operational amplifiers being connected with feedback loops, at least one of said transverse impedances comprising an active parallel-tuned oscillatory circuit feeding a negative-immitance converter, the latter including an additional operational amplifier with an inverting input connected to the downstream end of the respective series resistor and by way of a first collateral resistor to the output of said additional operational amplifier, a noninverting input of said additional operational amplifier being connected by way of a second collateral resistor to the output thereof and being further connected to an ungrounded terminal lead of the respective parallel-tuned circuit which also has a grounded terminal lead, one of said collateral resistors being provided with adjustment means for varying the conversion factor of said negative immitance converter which is proportional to the product of the ratio of the resistances of said collateral resistors and the respective impedance and with it the bandwidth of said filter element.

14. A filter element as defined in claim 13 wherein said parallel-tuned circuit comprises a first and a second ancillary amplifier of operational type with inverting inputs connected to said ungrounded terminal lead and with outputs connected by way of respective adjustable ancillary resistors to said ungrounded terminal lead, said first ancillary amplifier having a noninverting input grounded through a first capacitor and connected to the output of said second ancillary amplifier through a first additional resistor, said second ancillary amplifier having a noninverting input grounded through a second additional resistor and connected to the output of said first ancillary amplifier by way of a second capacitor.

15. A filter element as defined in claim 14, further comprising an adjustable transverse resistor bridging said ungrounded and grounded terminal leads between said negative-immitance converter and said parallel-tuned circuit for enabling a variation in a Q-factor possessed by the filter element.

16. A filter element as defined in claim 14 wherein said ancillary resistors are part of a potentiometer enabling adjustment of a midfrequency of said parallel-tuned circuit.

* * * * *